United States Patent
Chen et al.

(10) Patent No.: US 6,301,120 B1
(45) Date of Patent: Oct. 9, 2001

(54) CIRCUIT BOARD APPARATUS

(75) Inventors: Shiaw-Jong Steve Chen, Plano; Roger J. Hooey, Rockwall; Thang D. Truong, Grand Prairie, all of TX (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/493,325

(22) Filed: Jan. 28, 2000

(51) Int. Cl.$^7$ ............... H05K 7/02; H05K 7/06; H05K 7/08; H05K 7/10
(52) U.S. Cl. ............................................. 361/760
(58) Field of Search .................. 361/760; 439/73, 439/55, 65, 69, 74

(56) References Cited

U.S. PATENT DOCUMENTS 4,866,571 * 9/1989 Butt .............................. 361/386

* cited by examiner

Primary Examiner—Brian Sircus
Assistant Examiner—Chandrika Prasad
(74) Attorney, Agent, or Firm—Law office of Donald D. Mondul

(57) ABSTRACT

An improved circuit board apparatus configured for mounting electronic components in a circuit arrangement. The apparatus comprises a metal substrate having a first side and a second side, a first-side laminar structure and a second-side laminar structure. The first-side laminar structure includes at least one first-side conductive stratum alternated with at least one first-side dielectric stratum affixed at the first side. The second-side laminar structure includes at least one second-side conductive stratum alternated with at least one second-side dielectric stratum affixed at the second side of the metal substrate. The apparatus further comprises a plurality of electrically conductive interside courses intermediate selected first-side strata of the at least one first-side conductive stratum and selected second-side strata of the at least one second-side conductive stratum.

3 Claims, 2 Drawing Sheets

CIRCUIT BOARD APPARATUS

BACKGROUND OF THE INVENTION

The present invention is directed to electrical circuit board apparatuses and construction of components using electrical circuit board apparatuses. The present invention is especially directed to electrical circuit board apparatuses employed in constructing power supply circuits.

Current technology relating to circuit board construction, and especially relating to circuit board construction for high packaging density power supply components, places all control circuitry onto a double-sided surface-mounted control printed wiring board (PWB) to form a control module. Power circuitry is placed onto an insulated metal substrate (IMS) to form a power module. The two modules are assembled to form a power supply component. Assembly of the two modules is usually effected by stacking the two modules to physically combine them. Electrical connections between the two stacked modules are accomplished by pin arrangements or by wiring arrangements. Present technology for insulated metal substrate (IMS) circuit boards contemplates either single-layer or two-layer copper traces on one side of a metal substrate. No components are applied to the second side of the metal substrate; no circuit connections are made between the two sides of the metal substrate.

Integration of circuitry and increases in efficiency of circuitry enable design of circuits that do not require heat sinks for heat dissipation. Circuits with a metal substrate efficiently dissipate the heat generated and may be sufficiently cooled with air flow on the order of 300 linear feet per minute about the circuit.

There is a need for more compact and simpler construction of electronic circuitry, especially for electronic power circuitry. Component construction is desirable that advantageously employs recent improvements in integration and efficiency of electronic parts and components.

SUMMARY OF THE INVENTION

An improved circuit board apparatus configured for mounting electronic components in a circuit arrangement. The apparatus comprises a metal substrate having a first side and a second side, a first-side laminar structure and a second-side laminar structure. The first-side laminar structure includes at least one first-side electrically conductive stratum alternated with at least one first-side dielectric stratum affixed at the first side. The second-side laminar structure includes at least one second-side electrically conductive stratum alternated with at least one second-side dielectric stratum affixed at the second side of the metal substrate. The apparatus further comprises a plurality of electrically conductive interside courses intermediate selected first-side strata of the at least one first-side conductive stratum and selected second-side strata of the at least one second-side conductive stratum.

By such construction as is contemplated by the preferred embodiment of the present invention, compact, efficient, and thermally enhanced electronic components may be fashioned. Such favorable component characteristics are especially desirable in power electronic components.

It is, therefore, an object of the present invention to provide an improved circuit board apparatus configured for mounting electronic components in a circuit arrangement that is space-efficient and improved thermal characteristics.

It is a further object of the present invention to provide an improved electrical circuit apparatus using circuit board technology according to the present invention for advantage in space-efficiency and improved thermal characteristics.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
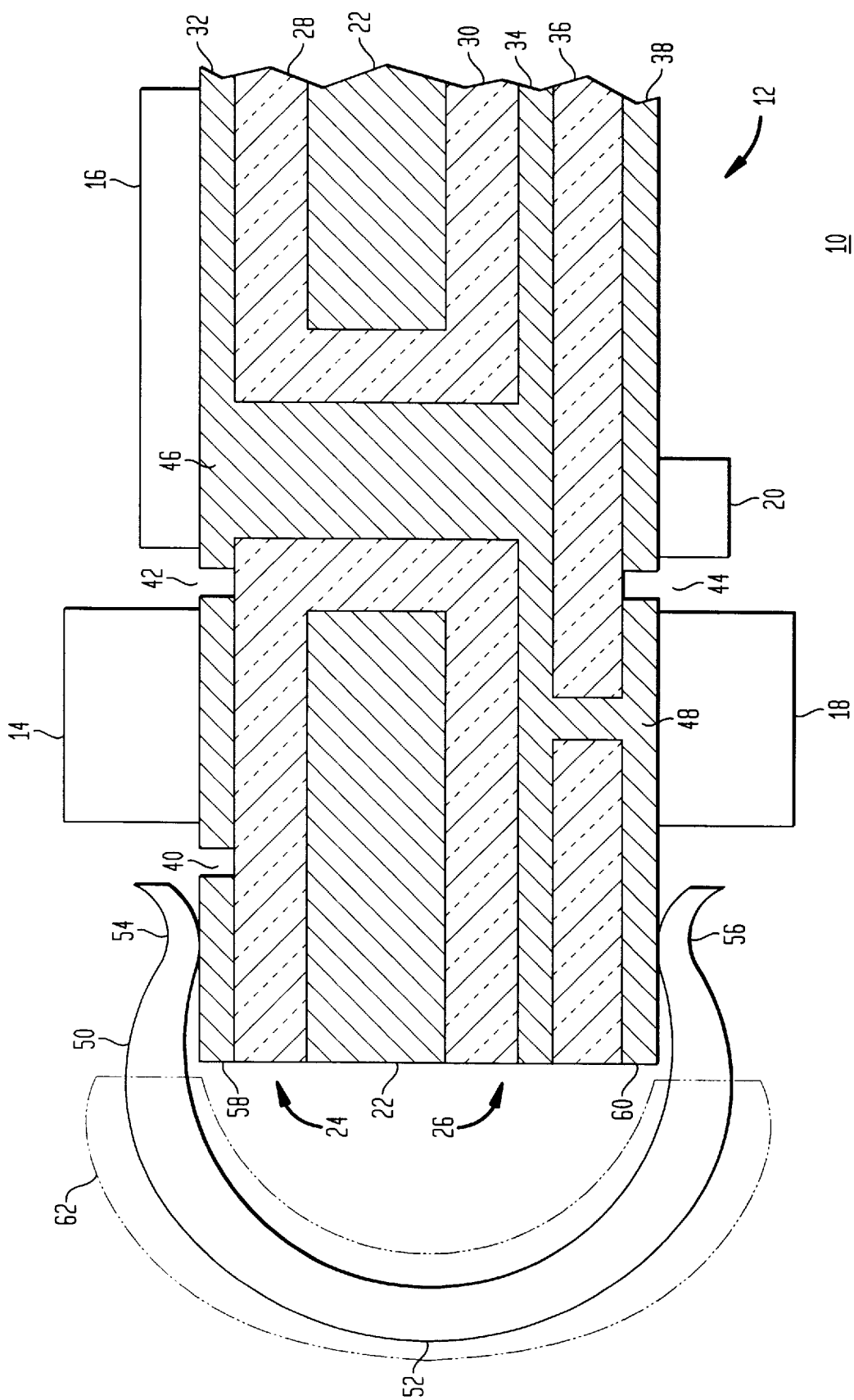
FIG. 1 is a partial section drawing of a portion of the preferred embodiment of the present invention employing a bridging clip to establish an electrically conductive interside course.

FIG. 1 is a partial section drawing of a portion of the preferred embodiment of the present invention employing a bridging clip to establish an electrically conductive interside course. In FIG. 1, a portion of an electrical circuit 10 includes a printed wiring board (PWB) 12 and a plurality of components 14, 16, 18, 20. PWB 12 has a first side 24 and a second side 26. PWB 12 has a metal substrate 22 intermediate first side 24 and second side 26.

First side 24 is illustrated as a single-layer side having a dielectric layer 28 affixed to metal substrate 22 and a conductive circuit trace 32 affixed to dielectric layer 28. First side 24 may as well be a multi-layer construction (as described, for example, in connection with second side 26 below). The present invention is not limited to first side 24 being a single-layer side. Second side 26 is a double-layer side having a dielectric layer 30 affixed to metal substrate 22, a conductive trace 34 affixed to dielectric layer 30, a dielectric layer 36 affixed to conductive trace 34 and a conductive trace 38 affixed to dielectric layer 36. Second side 26 may as well be a single-layer construction (as described above in connection with first side 24) or a multi-layer construction of greater than two layers. The present invention is not limited to second side 26 being a double-layer side.

Conductive traces 32, 34, 38 preferably are copper foil layers etched, or otherwise processed, to establish circuit paths appropriate for proper connections among components 14, 16, 18, 20 and other components (not shown in FIG. 1) to make up electrical circuit 10. Accordingly, in the section illustration of FIG. 1, there appear to be breaks 40, 42 in circuit trace 32, and a break 44 in circuit trace 38. As is understood by those skilled in the art, there is electrical continuity among portions of circuit trace 32 interconnecting components 14, 16 and other components (not shown in FIG. 1). Likewise, there is electrical continuity among portions of circuit trace 38 interconnecting components 18, 20 and other components (not shown in FIG. 1).

An interside via, or interside circuit course 46 extends through metal substrate 22, electrically connecting circuit trace 32 with circuit trace 34. Dielectric layers 28, 30 extend the length of interside circuit course 46 precluding electrical shorting of circuit courses 32, 34 with metal substrate 22. Intraside via, or intraside circuit course 48 extends intermediate circuit courses 34, 38. Intraside circuit course 48 electrically connects circuit courses 34, 38.

Another interside connection structure that establishes an electrically conductive interside course is embodied in a clamp, or clip 50. Clip 50 is preferably constructed having a bight section 52 connecting contact sections 54, 56. Clip 50 is preferably constructed of an electrically conductive material having spring characteristics sufficient to provide clamping engagement by clip 50 with printed wiring board 12 clampingly engaged intermediate contact sections 54, 56. Such clamping engagement by clip 50 with printed wiring board 12 effects electrical connection intermediate circuit sections 58, 60. By such clamping engagement, direct electrical connection may be established between selected, generally edge-oriented circuit sections, such as circuit sections 58, 60 without a circuit layout requiring employment of interside circuit courses (e.g., interside circuit course 46) or intraside circuit courses (e.g., intraside circuit course 48). Flexibility of circuit design in electrical circuit 10 is beneficially provided with the expedient connection structure of clip 50. Insulation 62 (shown in phantom in FIG. 1) may be employed to insulatingly enclose clip 50 to preclude shorting adjacent circuits or components in an installed arrangement.

Figure 2:
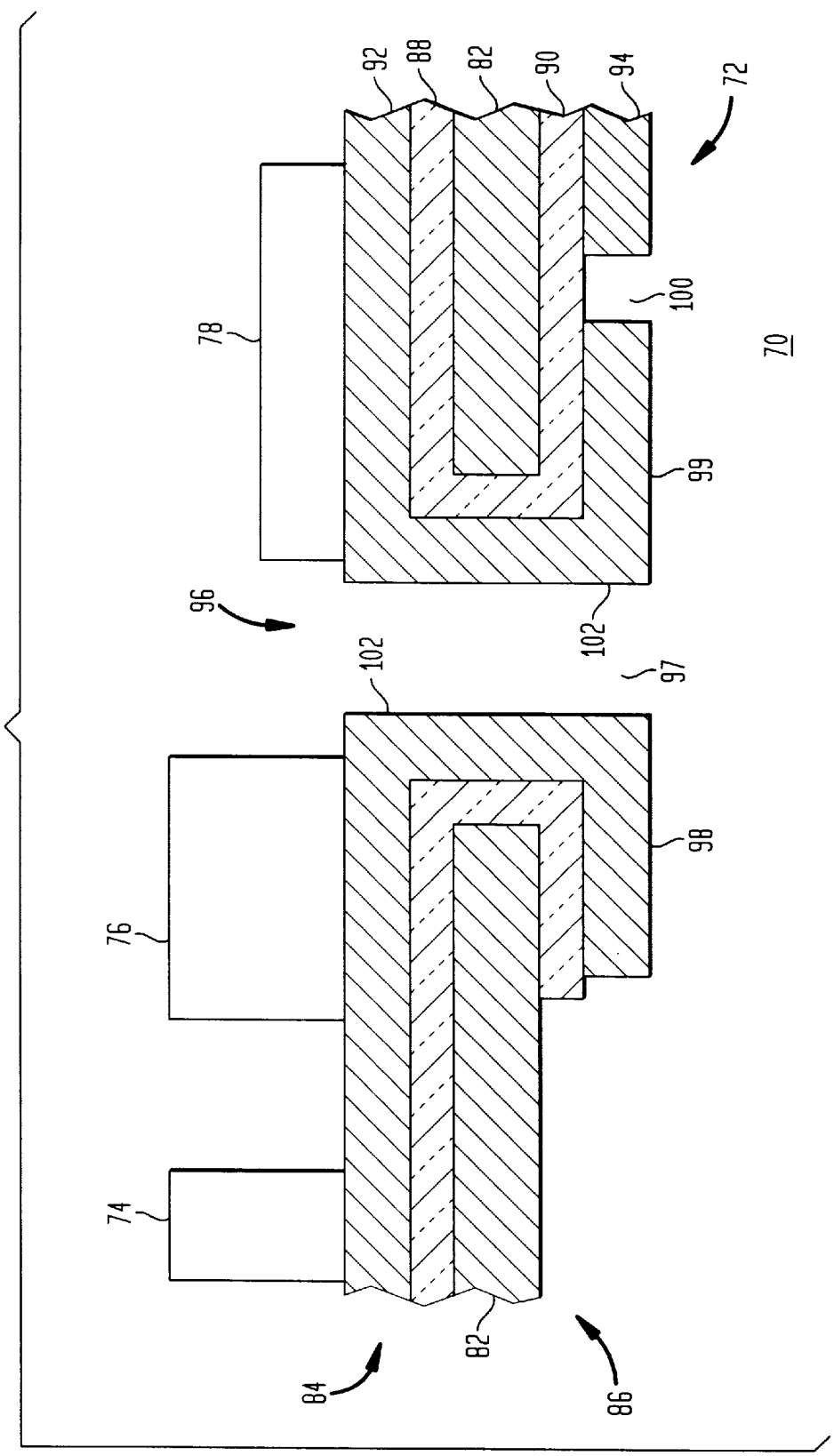
FIG. 2 is a section drawing of a portion of the preferred embodiment of the present invention employing another structure for establishing an electrically conductive interside course.

In FIG. 2, a portion of an electrical circuit 70 includes a printed wiring board (PWB) 72 and a plurality of components 74, 76, 78. PWB 72 has a first side 84 and a second side 86. PWB 72 has a metal substrate 82 intermediate first side 84 and second side 86. In the embodiment of the present invention illustrated in FIG. 2, first side 84 is a single layer side. Second side 86 is partially a single-layer side. First side 84 includes a dielectric layer 88 affixed to metal substrate 82 and a conductive circuit trace 92 affixed to dielectric layer 88. First side 84 may as well be a multi-layer construction (as described, for example, in connection with second side 26 above, FIG. 1). The present invention is not limited to first side 84 being a single-layer side.

Second side 86 is partially a single-layer side having a dielectric layer 90 affixed to metal substrate 82 and a conductive circuit trace 94 affixed to dielectric layer 90. Second side 86 may as well be a multi-layer construction (as described, for example, in connection with second side 26 above, FIG. 1). The present invention is not limited to second side 86 being a partial single-layer side.

An interside circuit course 96 extends from first side 84 to second side 86. Interside circuit course 96 includes an aperture 97 with a wall 102. Circuit trace 94 occupies a relatively small area on one side 98 of interside circuit course 96 at second side 86. Circuit trace 94 extends substantially the full expanse of second side 86 on another side 99 of interside circuit course 96, with a break 100 in circuit trace 94. Break 100 illustrates that etching or other processing of circuit trace 94 may present apparent voids in selected sections of electrical circuit 70, as was described in greater detail in connection with FIG. 1. In the interest of avoiding prolixity, that description will not be repeated here.

Circuit traces 92, 94 extend into aperture 97 and cooperate to establish electrical continuity between first side 84 and second side 86. Dielectric layers 88, 90 also extend into aperture 97 and cooperate to insulate metal substrate 82 from circuit traces 92, 94, thereby precluding shorting between metal substrate 82 and circuit traces 92, 94. Interside circuit course 96 presents an electrical structure at second side 86 that is particularly well configured for connection with other circuit components, modules or the like (not shown in FIG. 2). In particular, interside circuit course 96 presents a conductive area established by circuit trace 94 around aperture 97 at second side 86 that is particularly well configured for surface mounting applications.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

What is claimed is:

1. An improved circuit board apparatus configured for mounting electronic components in a circuit arrangement; the apparatus comprising:

(a) a metal substrate having a first side and a second side;

(b) a first-side laminar structure including at least one first-side conductive stratum alternated with at least one first-side dielectric stratum affixed at said first side;

(c) a second-side laminar structure including at least one second-side conductive stratum alternated with at least one second-side dielectric stratum affixed at said second side; and (d) a plurality of electrically conductive interside courses intermediate selected first-side strata of said at least one first-side conductive stratum and selected second-side strata of said at least one second-side conductive stratum;

said first-side laminar structure having a first most distal stratum from said metal substrate and said second-side laminar structure having a second most distal stratum from said metal substrate; said first most distal stratum and said second most distal stratum each being a conductive stratum; at least one of said plurality of electrically conductive interside courses clampingly engaging said first most distal stratum and said second most distal stratum to electrically connect said first most distal stratum with said second most distal stratum.

2. An improved electrical circuit apparatus comprising:

(a) a substrate having a first side and a second side;

(b) a first-side structure including at least one first-side conductive stratum affixed at said first side;

(c) a plurality of first electronic components electrically affixed with selected conductive strata of said at least one first-side conductive stratum;

(d) a second-side structure including at least one second-side conductive stratum affixed at said second side;

(e) a plurality of second electronic components electrically affixed with selected conductive strata of said at least one second-side conductive stratum;

(f) a plurality of electrically conductive interside courses clampingly engaging selected first-side strata of said at least one first-side conductive stratum and selected second-side strata of said at least one second-side conductive stratum;

(g) said plurality of first electronic components, said plurality of second electronic components and said plurality of electrically conductive interside courses cooperating to establish said electrical circuit.

3. An improved circuit board apparatus configured for mounting electronic components in a circuit arrangement; the apparatus comprising:

(a) a metal substrate having a first side and a second side;

(b) a first-side laminar structure including a first-side dielectric stratum adjacent said first side and a first-side conductive stratum adjacent said first-side dielectric stratum;

(c) a second-side laminar structure including a second-side dielectric stratum adjacent said second side and a second-side conductive stratum adjacent said second side dielectric stratum; and (d) a plurality of electrically conductive interside courses intermediate said first-side conductive strata and said second-side conductive stratum;

at least one of said plurality of electrically conductive interside courses clampingly engaging said first-side conductive stratum and said second-side conductive stratum to electrically connect said first-side conductive stratum with said second-side conductive stratum.

* * * * *